United States Patent [19]

Ito

[11] Patent Number: 4,774,526

[45] Date of Patent: Sep. 27, 1988

[54] FAULT DETECTION CIRCUIT FOR A THERMAL PRINT HEAD

[75] Inventor: Toyozo Ito, Itwate, Japan

[73] Assignee: Kabushiki Kaisha Sato, Japan

[21] Appl. No.: 906,230

[22] Filed: Sep. 11, 1986

[30] Foreign Application Priority Data

Sep. 14, 1985 [JP] Japan ............................ 60-202542

[51] Int. Cl.[4] .................... G01D 18/00; G01R 19/145

[52] U.S. Cl. ............................ 346/76 PH; 219/216; 219/486; 324/542; 340/640; 340/655

[58] Field of Search ................ 219/216 PH, 216, 483, 219/486, 501; 346/76 PH, 76 R; 400/120; 324/537, 539, 542, 556; 340/640, 652, 654, 655

[56] References Cited

U.S. PATENT DOCUMENTS

| | | | |
|---|---|---|---|
| 4,207,517 | 6/1980 | Bloxam | 324/556 |
| 4,220,912 | 9/1980 | Williams | 324/539 |
| 4,500,893 | 2/1985 | Sakura et al. | 346/76 PH |
| 4,573,058 | 2/1986 | Brooks | 346/76 PH |
| 4,595,935 | 6/1986 | Brooks et al. | 346/76 PH |

*Primary Examiner*—M. H. Paschall

*Assistant Examiner*—H. L. Williams

*Attorney, Agent, or Firm*—Ostrolenk, Faber, Gerb & Soffen

[57] ABSTRACT

A thermal printer with a fault detection circuit for detecting faults in heating elements of the printer includes a print head containing heating elements and a heating circuit for each heating element and a power supply for supplying power to the heating elements. Power is supplied to the print head either directly through one terminal of the power supply or indirectly, during a test mode, through a fault detection circuit which is also connected to the print head. The fault detection circuit includes a constant voltage source, preferably formed of series-connected diodes, through which power flows to the print head. Current passing through the constant voltage source activates a photocoupler having an output the voltage of which determines whether a current is or is not flowing into the print head. A CPU which controls overall operations in the printer monitors the photocoupler and selects either a normal printing mode or a print head test mode. In the test mode, the CPU enables sequentially each of the heating circuits to determine their functional integrity.

11 Claims, 3 Drawing Sheets

FAULT DETECTION CIRCUIT FOR A THERMAL PRINT HEAD

BACKGROUND OF THE INVENTION

The present invention relates to a thermal print head and more particularly to a fault detection circuit adapted for detecting and isolating failures or faults in any of the heating elements or heating circuits contained in the thermal print head.

Conventional print heads of thermal printers contain a plurality of heating circuits, each comprised of a heating element and a gating circuit for controlling when electrical current passes through the heating element. Each gating circuit typically contains transistors, logic gates and the like. A failure in any one component of any given heating circuit will disable part of the dot matrix pattern that is output during printing, rendering the print head nonfunctional. The most frequent cause for failures results from circuit line breakage in the heating elements.

It has been proposed, as described for example in Japanese Laid-Open Patent Application No. 58 (1983) - 28391, to sequentially direct a low test current that is not high enough for printing, through each of the heating circuits. According to the method, a fault is detected if the current does not pass through any one of the heating circuits. The method is implemented with the aid of resistors having a low resistance value which are connected in series between the heating circuits and a common terminal side of the print head. When current is sequentially supplied to each of the heating circuits, a voltage across the resistors is sensed to determine whether current has passed through the heating circuits.

The above approach suffers from the drawback that in order to detect the very low test currents, an amplification circuit of a high amplification factor is needed to permit sensing of the test currents. Frequent adjusting of the amplification factor is also necessary. As a result, the testing circuitry becomes complicated and the time for completing a test is sufficiently long to constitute a real drawback of this checking process. Furthermore, because the testing relies on the value of the resistances and because manufacturing variations produce inconsistent resistance values in the heating elements themselves, it is necessary to carry out fine adjustment of the amplification factor for each thermal print head. It is difficult to simultaneously accommodate all of the variations in all of the resistances of all of the heating elements in any given thermal print head.

SUMMARY OF THE INVENTION

Accordingly, it is an object of the present invention to provide a fault detection circuit for a thermal print head which is simple in design and which enables a comparatively rapid completion of the checking process.

It is a further object of the invention to provide a fault detection circuit of the above type which does not require adjustment or calibration.

It is another object of the invention to provide a fault detection for a thermal print head which is operable notwithstanding the inconsistent resistance values of the heating elements associated with the print head.

The foregoing and other objects are realized according to the present invention in a printing system which includes a print head containing heating circuits and a respective heating element in each heating circuit and a power supply for supplying electrical power to the heating circuits through a first path. A fault detection circuit for testing the heating circuits is disposed in parallel with the first path and in series between the power supply and the print head. The power supply is controllable such that in a first mode, used for normal operations, power is supplied to the print head directly over the first path and in a second, test mode, power is supplied through the fault detection circuit to enable the carrying out of a print head checking process.

In a preferred embodiment, the fault detection circuit of the present invention comprises a constant voltage source, preferably constructed of several series-connected diodes. A constant voltage develops across the series connected diodes. A photocoupler is connected to the constant voltage source, i.e. parallel to the diodes, and is driven by the potential difference that develops across the diodes when current passes therethrough. An output of the photocoupler changes states depending on the absence or presence of a current through the diodes.

A control circuit which is coupled to the heating elements in the print head is designed to control the heating circuits such that one heating circuit is enabled at any given time for receiving power from the power supply through the fault detection circuit. The inability of any given heating circuit to conduct electrical power is detectable by sensing the output voltage of the photocoupler. In this manner, by sequential enablement of each one of the heating circuits and by detecting the photocoupler's output voltage, the photocoupler enables complete and rapid testing of the entire print head.

Other features and advantages of the present invention will become apparent from the following description of a preferred embodiment of the invention provided in reference to the following drawings.

DESCRIPTION OF PREFERRED EMBODIMENTS

Figure 1:
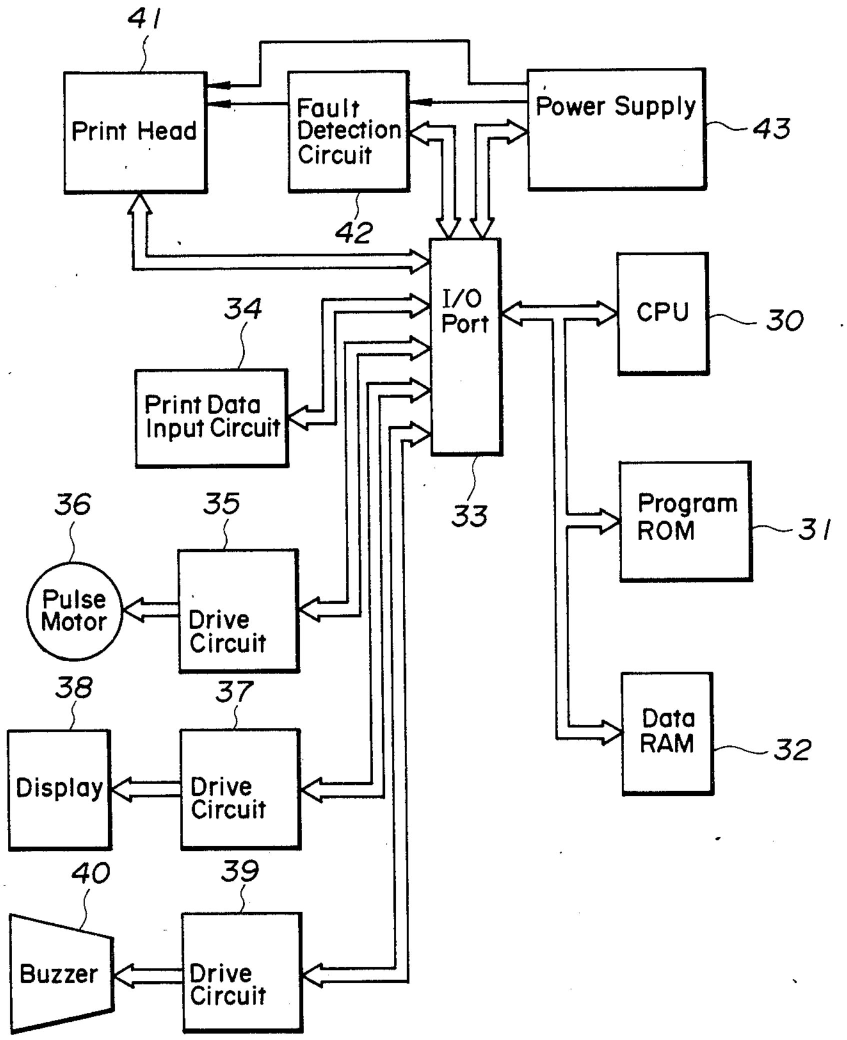
FIG. 1 is a block diagram of a thermal printer having a thermal print head with heating circuits and a detection circuit according to the present invention.

FIG. 1 illustrates a CPU 30 which is coupled to a program ROM 31, a data RAM 32 and an I/O port 33. Overall control of all printer functions, including printing and control of fault detection functions is through CPU 30 based on program steps that are stored in program ROM 31. RAM 32 is used for storing printing data, the location or identity of faulty heating circuits derived from the checking process and various other data necessary for operating the thermal printer.

CPU 30 interfaces and controls a variety of peripheral equipment contained in the thermal printer system through I/O port 33. I/O port 33 is interfaced to a print data input circuit 34 through which data to be printed is inputted; a drive circuit 35 for driving a pulse motor 36 provided for transporting printing paper; a drive circuit 37 for driving display 38, for example a CRT; a drive circuit 39 for actuating a buzzer 40; and a thermal print head 41.

Power supply 43 supplies power to print head 41 through fault detection circuit 42. Both fault detection circuit 42 and power supply 43 are connected to I/O port 33 so that both are either monitored by of under control of CPU 30 in accordance with the program that is stored program ROM 31.

Figure 2:
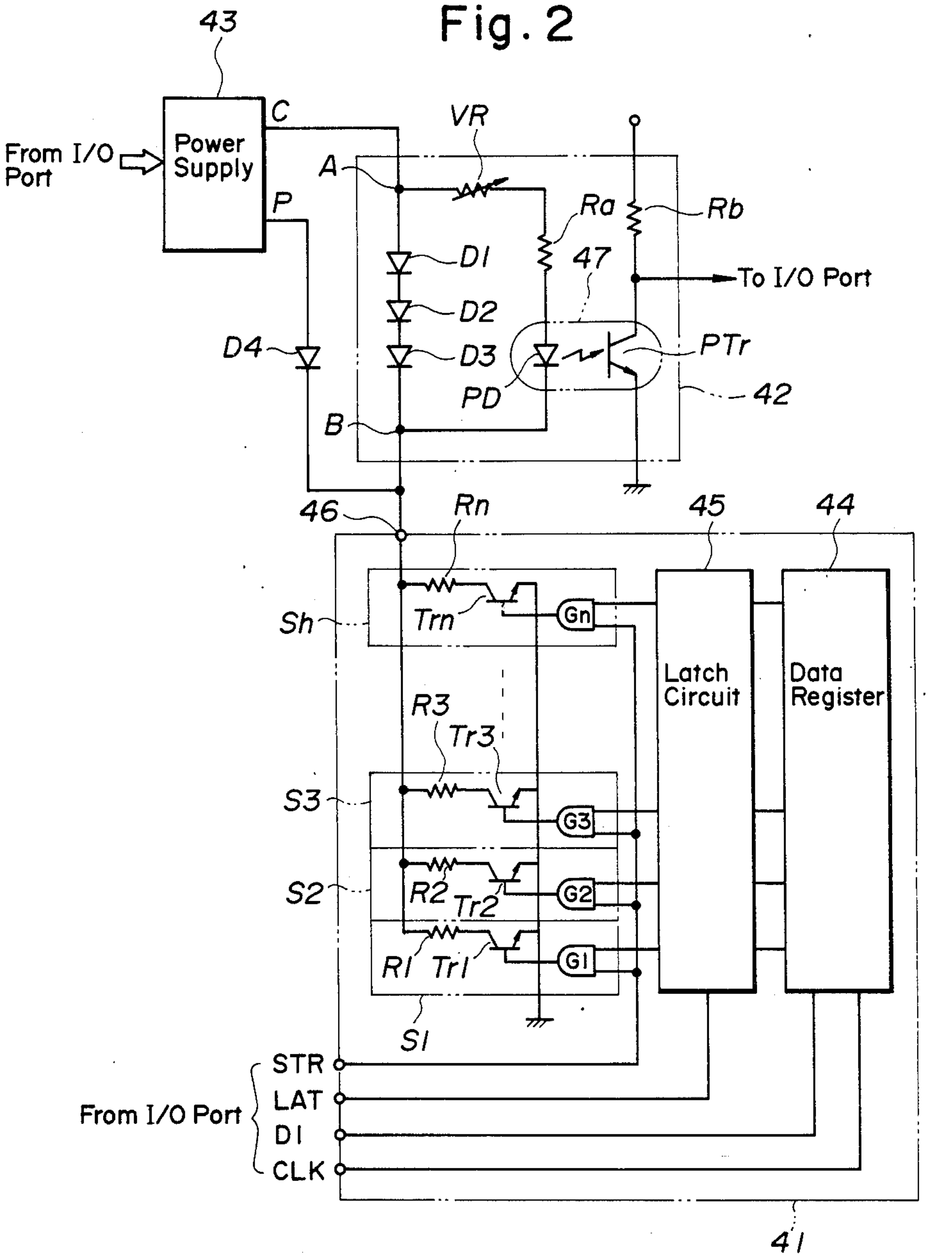
FIG. 2 is a circuit diagram showing the main components of the present invention.

Components of print head 41, fault detection circuit 42 and power supply 43 are shown in greater detail in FIG. 2. Thus, print head 41 includes data register 44 which is constructed of shift registers, a latch circuit 45, and "n" heating circuits S1, S2, S3 . . . Sn. Each one of heating circuits S1, S2, S3 . . . Sn is comprised of AND gates G1, G2, G3 . . . Gn, transistors Tr1, Tr2, Tr3 . . . Trn, and heating elements R1, R2, R3 . . . Rn.

A single line of dots is stored in data register 44, the data being inputted to data register 44 through data input DI which supplies one data bit at a time via I/O port 33 for each pulse of clock signal CLK. Latch circuit 45 is coupled to data register 44 and data in data register 44 is latched or stored into latch circuit 45 each time latch signal LAT is activated via I/O port 33.

Each of the output lines of latch circuit 45 is connected to a respective input terminal of AND gates G1, G2, G3 . . . Gn. A second input terminal of the AND gates G1, G2, G3 . . . Gn is connected to a strobe signal STR that is provided from I/O port 33. The outputs of AND gates G1, G2, G3 . . . Gn are connected to the bases of transistors Tr1, Tr2, Tr3 . . . Trn. The emitters of the transistors are grounded and their collectors are connected to respective ones of heating elements R1, R2, R3 . . . Rn. A common terminal 46 through which power is supplied to print head 41 serves as a common terminal for the other end of the heating elements.

Power supply 43 outputs two voltages, preferably of the same voltage level, through outputs B and C thereof. For normal operations power is supplied through terminal P directly to common terminal 46 of print head 41, via diode D4. During the testing phase, power is supplied through terminal C which is connected to fault detection circuit 42.

Fault detection circuit 42 includes diodes D1, D2 and D3, fixed resistors Ra and Rb, variable resistor VR, and photocoupler 47 which are interconnected is described below.

Diodes D1, D2 and D3 are series connected silicon diodes which are disposed between terminal C of power supply 43 and print head 41. One end of variable resistor VR is connected to the anode of diode D1 and the other end of resistor VR is connected to fixed resistor Ra. The photodiode PD component of photocoupler 47 is connected at its cathode end to the cathode of diode D3 and the anode thereof is connected to resistor Ra. In this fashion, photodiode PD and the associated series resistances Ra and VR are connected in parallel across diodes D1, D2 and D3.

When power is delivered through terminal C of power supply 43 the voltage that develops across diodes D1, D2, and D3 is constant due to the well-known forward conduction voltage characteristic of diodes. Therefore, the diodes form a constant voltage source which fixes the voltage between nodes A and B in FIG. 2.

Whenever power is supplied through terminal C of power supply circuit 43, a predetermined voltage is produced between points A and B. Consequently a current will flow through resistors VR, Ra and through photodiode PD causing the photodiode to emit light. The emitted light supplies, in the familiar manner, base drive to phototransistor PTr.

Any number of diodes may be used to produce a desired voltage potential between terminals A and B. The selection of three diodes is merely indicative of one desired preferred arrangement. Note too that variable resistor VR is provided for adjusting the actual value of the current that will flow through photodiode PD.

At the output stage of photocoupler 47, note the emitter of phototransistor PTr which is grounded and the collector which is connected to a power source via resistor Rb. The output of photocoupler 47 is taken at the collector of phototransistor PTr which collector is connected to I/O port 33. CPU 30, which is coupled to I/O port 33, monitors the voltage level at the collector of phototransistor PTr during the checking operation which generally proceeds as follows.

During the testing phase each of the heating circuits will be sequentially enabled by CPU 30 in accordance with a program stored in ROM 31. Power is supplied during the testing phase from terminal C of power supply 43. If a fault or failure is present in any of heating circuits S1, S2, S3, . . . , Sn current will not flow through the diodes D1, D2 and D3 of the constant voltage source and a voltage potentia1 will not develop between points A and B. Consequently, no power will be available for powering photodiode PD and the voltage at the collector of phototransistor PTr will be high. On the other hand, if the heating circuits are in good operating condition, a voltage potential will develop between point A and B. Photodiode PD will emit light and the collector of phototransistor PTr will be at a low voltage. During the time when each one of heating circuits S1, S2, S3 . . . , Sn is enabled CPU 30 monitors the collector output of phototransistor PTr and makes a determination whether that given one of the heating circuits is in good operating condition as would be the case if the potential at the collector of the phototransistor PTr is at a low voltage.

Figure 3:
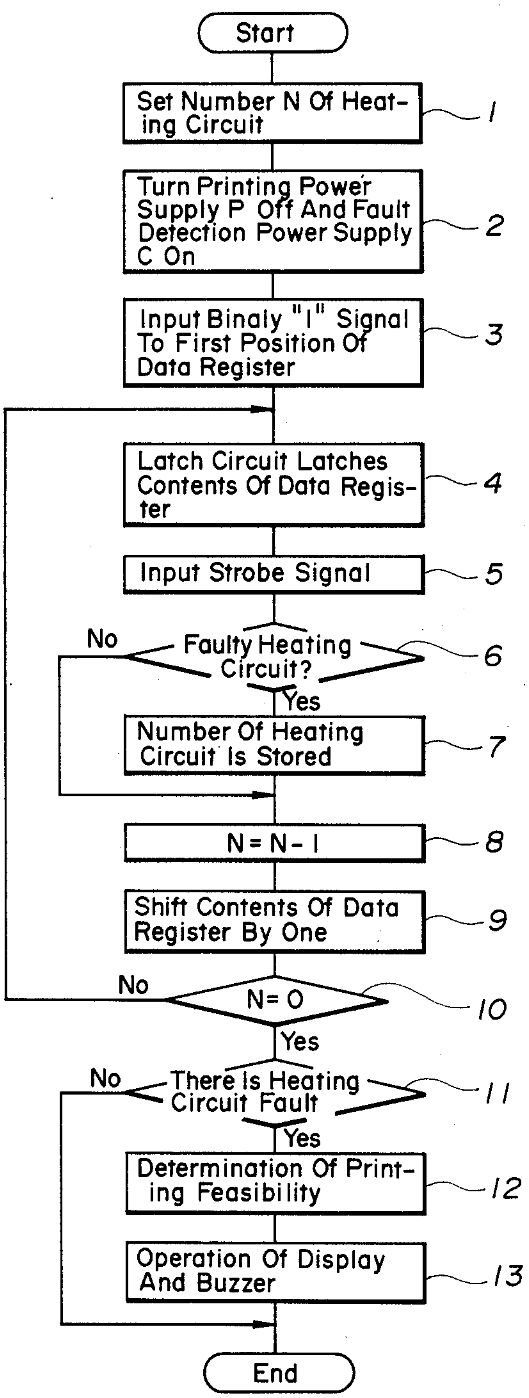
FIG. 3 is a flow chart depicting testing steps that are carried out in the fault detection circuit of the present invention.

The heating circuit testing process is more fully described by reference to the flow chart of FIG. 3.

In step 1, the total number of heating circuits S1, S2, S3 . . . , Sn, equal to the total number of dots in print head 41, is stored in a predetermined address of data ROM 32. Thereafter, in step 2, power is turned off to power supply terminal P and applied instead to terminal C through which it will be supplied to common terminal 46 of print head 41 via fault detection circuit 42. In the next step, input data line DI is set to a high value and the clock signal CLK is actuated momentarily. As a result, a binary "1" is stored in the first stage of data register 44 (which is constituted of a shift register).

Therefter, in step 4, latch signal LAT is activated momentarily whereby the contents of data register 44 are transferred to latch circuit 45. When, in addition, strobe signal STR is activated AND gate G1 has a high output which activates transistor Tr1 permitting heating current to flow in heating circuit S1. During this time, current is expected to flow in the enabled heating circuit and the voltage value at the collector of phototransistor PTr is expected to assume a low voltage to indicate that heating circuit S1 is in good working order. If the voltage level is at a high level, a fault or failure is indicated.

As previously noted, the inability of heating circuit S1 to conduct current in response to a faulty condition such as a circuit line break or the like will prevent current from flowing through the diodes of the constant voltage source and therefore no fault potential difference develops between points A and B. As a result, photodiode PD will not emit light that is needed to cause phototransistor PTr to become conductive. As a result the collector side of the phototransistor assumes a high voltage. If, however, current indeed flows a voltage develops between points A and B. For obvious reasons the collector of phototransistor of PTr will be therefore at ground voltage. Care is taken to assure that during the testing of any given heating circuit, the duration of strobe signal STR is sufficiently short to assure that a dot will not be printed during the test mode.

If it is determined in step 6 that no fault exists, the program proceeds to step 8. On the other hand if a fault is detected, a predetermined respective value assigned to that heating circuit which is currently being tested is stored at a specific location in data RAM 32. The count value N can be used for identifying the heating circuits. In step 8, the count N is decremented to indicate and identify the next heating circuit that is selected for testing. Then, in step 9, another clock pulse is output on clock signal CLK while the input data DI which is applied to data register 44 is maintained at a low logic level. Therefore, the binary "1" signal is shifted from the first to the second position of data register 44. This enables only the second heating circuit, namely heating circuit S2.

However, before proceeding with the next test step, namely step 10, the value N is compared to zero. If it is not zero, the test continues by repeating the procedures of steps 4 through 10, substantially as described above. However, when the last heating circuit, namely heating circuit Sn, will have been tested N will be zero and the process then proceeds to step 11.

In step 11, it is determined whether a faulty heating circuit was detected. If none was found, the testing phase is terminated and printing or other normal function are begun. If on the other hand, a faulty heating circuit was found, the data that was stored to identify the faulty heating circuits is examined to determine the extent and number of faulty heating circuits. A determination is then made whether printing is possible notwithstanding the faults.

Finally, in step 13, display 38 is used to display a message to indicate whether printing is possible and further to show the number and/or identity of faulty heating circuits. A buzzer is then sounded to signal the completion of the fault detection operation.

The focus of the present invention is on a fault detection circuit for a thermal printer and not on a thermal printer per se. Therefore, the basic components of a thermal printer were not described. It is noted, however, that the testing phase is concluded by activating the voltage at terminal P of power supply 43 and by turning the voltage off at terminal C to enable normal printing operations to proceed as for example by controlling the print data that is input to data register 44. During all printing operations, the pulse width of strobe signal STR is set sufficiently wide to permit heating elements R1, R2, R3, . . . , Rn to print.

In the above embodiment, the voltage at terminals P and C of power supply 43 can be supplied by separate power supply circuits for generating the voltage at each terminal of power supply 43. In the alternative, the fault detection power that is supplied to terminal C may be utilized for normal printing operations in addition to its fault detection purposes. Note that even if power is supplied through terminal C during normal operations, the voltage drop across fault detection circuit 42 remains roughly constant regardless of the number of heating elements R1, R2, R3 . . . , Rn that are present in the printer head. Therefore, the voltage applied to photocoupler 47 remains constant regardless of the number of heating elements and no damage will ensue even if the fault detection circuit is in the circuit during normal operations.

Furthermore, although it was suggested above that the strobe signal STR be made sufficiently narrow to prevent printing during the testing phase, other alternatives are also available. For example, the duration of strobe signal STR may have a constant value and instead the voltage level that is supplied through power supply 43 at terminal C is controlled to assure that printing will not occur during the testing phase.

With the above-described fault detection circuit of the present invention, a specially provided amplification circuit having a high amplification factor is not needed. Similarly, fine adjustment or calibration circuitry is also unnecessary. The fault detection circuit is extremely simple. It is easily and inexpensively manufacturable and allows very rapid testing of the print head. The features of the fault detection circuit of the present invention make it very attractive commercially.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A fault detection circuit for a thermal printer, comprising:

- a print head having heating circuits therein;
- a testing circuit coupled to the print head for testing its heating circuits;
- a power supply for supplying electrical power to the print head and a control means for supplying the electrical power to the print head either directly or indirectly through the testing circuit; and
- the testing circuit comprising a constant voltage source including a plurality of diodes connected in series with one another for producing a constant voltage across the diodes when current flows through the diodes to the print head, the constant voltage source being connected in series between the power supply and the print head, and the testing circuit further including a photocoupler and said photocoupler including a light emitting diode which is coupled in parallel to and driven by the constant voltage of the constant voltage source, the photocoupler being effective for indicating whether or not current flows from the constant voltage source to the print head.

2. The fault detection circuit of claim 1, further comprising a central processing unit (CPU) for controlling and monitoring the operation of the power supply, the constant voltage source and the print head.

3. The fault detection circuit of claim 2, in which the power supply includes a first output for supplying power directly to the print head and a second output to which the constant voltage source is coupled, the CPU including means for selectively enabling the first and second outputs of the power supply.

4. The fault detection circuit of claim 2, in which the print head comprises a predetermined number of heating circuits, the detection circuit including a semiconductor storage device for controlling respectively and individually an On/Off state of the heating circuits and means for controlling the contents of the semiconductor storage device in response to control signals from the CPU.

5. The fault detection circuit of claim 4, further comprising means for selectively and sequentially enabling, mutually exclusively, each of the heating circuits and for determining whether current is conducted to the enabled heating circuit.

6. The fault detection circuit of claim 1, further comprising display means for indicating thereon whether a fault condition exists in the print head.

7. The fault detection circuit of claim 6, further comprising means for displaying the identity of heating circuits which have been found defective, if any.

8. The fault detection circuit of claim 1, in which the diodes are silicon diodes.

9. The fault detection circuit of claim 1, which further includes pulse generating means for generating enabling pulses for the heating circuit and means for controlling the width of said pulses such that printing will not occur during the test mode.

10. The fault detection circuit of claim 1, in which the constant voltage source is connected to a predetermined output of the power supply, the power supply including means for controlling the voltage at the predetermined output such that the print head will not print during the test mode.

11. A fault detection circuit for a thermal printer, comprising:

a print head having heating circuits therein;

a power supply for supplying electrical power to the print head;

a constant voltage source comprising a plurality of diodes connected in series with one another and disposed in series between the power supply and the print head;

a photocoupler responsive to an electrical potential produced across the series connected diodes, the photocoupler having a collector output which indicates the functional integrity of the print head in response to current flowing through the diodes; and a control circuit for sequentially enabling each one of the heating circuits of the print head and for detecting the collector output of the print head and for detecting the collector output for ascertaining the functional integrity of the print head.

* * * * *